United States Patent
Do et al.

(10) Patent No.: US 7,816,202 B2
(45) Date of Patent: Oct. 19, 2010

(54) METHOD FOR FABRICATING CAPACITOR IN SEMICONDUCTOR DEVICE

(75) Inventors: Kwan-Woo Do, Ichon-shi (KR); Jae-Sung Roh, Ichon-shi (KR); Kee-Jeung Lee, Ichon-shi (KR); Deok-Sin Kil, Ichon-shi (KR); Young-Dae Kim, Ichon-shi (KR); Jin-Hyock Kim, Ichon-shi (KR); Kyung-Woong Park, Ichon-shi (KR)

(73) Assignee: Hynix Semiconductor Inc., Icheon-si (KR)

(*) Notice: Subject to any disclaimer, the term of this patent is extended or adjusted under 35 U.S.C. 154(b) by 30 days.

(21) Appl. No.: 12/163,937

(22) Filed: Jun. 27, 2008

(65) Prior Publication Data

US 2009/0061587 A1 Mar. 5, 2009

(30) Foreign Application Priority Data

Aug. 31, 2007 (KR) .................. 10-2007-0088047

(51) Int. Cl.
*H01L 21/8242* (2006.01)

(52) U.S. Cl. .............. 438/239; 438/243; 438/244; 438/386; 438/387; 438/396; 438/397; 438/650; 438/661; 438/686

(58) Field of Classification Search ............... None
See application file for complete search history.

(56) References Cited

U.S. PATENT DOCUMENTS 5,864,153 A * 1/1999 Nagel et al. ............ 257/296
6,872,995 B2 * 3/2005 Hase ..................... 257/295
7,229,917 B2 * 6/2007 Umehara et al. ........ 438/650
7,271,054 B2 * 9/2007 Hase ..................... 438/240

FOREIGN PATENT DOCUMENTS

| CN | 1309814 | | 8/2001 |
|---|---|---|---|
| CN | 1093319 | C | 10/2002 |
| CN | 1176245 | C | 11/2004 |
| CN | 1215549 | C | 8/2005 |
| KR | 1020020002722 | A | 1/2002 |
| KR | 1020040039982 | A | 5/2004 |
| KR | 1020040085805 | A | 10/2004 |
| KR | 1020050122426 | A | 12/2005 |
| KR | 1020060104507 | A | 10/2006 |
| KR | 100770276 | B1 | 10/2007 |

* cited by examiner

*Primary Examiner*—Zandra Smith
*Assistant Examiner*—Khanh B. Duong
(74) *Attorney, Agent, or Firm*—Townsend and Townsend and Crew LLP

(57) ABSTRACT

A method for fabricating a capacitor includes providing a substrate having a capacitor region is employed, forming a first $Ru_{1-x}O_x$ layer over the substrate, forming a Ru layer for a lower electrode over the first $Ru_{1-x}O_x$ layer and deoxidizing the first $Ru_{1-x}O_x$ layer, forming a dielectric layer over the Ru layer for a lower electrode, and forming a conductive layer for an upper electrode over the dielectric layer, wherein the first $Ru_{1-x}O_x$ layer contains oxygen in an amount less than an oxygen amount of a $RuO_2$ layer.

27 Claims, 7 Drawing Sheets

METHOD FOR FABRICATING CAPACITOR IN SEMICONDUCTOR DEVICE

CROSS-REFERENCE TO RELATED APPLICATIONS

The present invention claims priority of Korean patent application number 2007-0088047, filed on Aug. 31, 2007, which is incorporated by reference in its entirety.

BACKGROUND OF THE INVENTION

The present invention relates to a method for fabricating a semiconductor device, and more particularly, to a method for fabricating a capacitor using a metal layer, e.g., a ruthenium (Ru) layer, as a lower electrode or an upper electrode in a semiconductor device.

Generally, a capacitor in a memory cell includes a lower electrode for a storage, a dielectric layer, and an upper electrode for a plate. To acquire a large capacitance within limited dimensions, it is required to secure a thin dielectric layer, decrease effective dimensions by forming a three-dimensional capacitor, or apply a dielectric layer with a high permittivity such as a tantalum pentoxide ($Ta_2O_5$) layer.

When the $Ta_2O_5$ layer is used as a dielectric layer in a capacitor having a structure of Metal-Insulator-Polysilicon (MIS) where a lower electrode includes polysilicon, the polysilicon is oxidized during a high temperature heat treatment process performed after the formation of the $Ta_2O_5$ layer. Thus, a valid dielectric layer becomes thick decreasing the capacitor capacitance. Furthermore, it is difficult to acquire precise electric characteristics from the capacitor due to an electric current change caused by an asymmetrical electric current-voltage characteristic of the MIS-structured capacitor.

Thus, for instance, when the capacitor is formed to have a thickness not greater than 0.1 μm, it employs a structure having the metal layer, e.g., a Ru layer, as a lower electrode, instead of polysilicon, such as a Metal-Insulator-Metal (MIM) structure or the MIP structure. For instance, in the MIM-structured capacitor, a metal layer for a lower electrode, a dielectric layer, and a metal layer for an upper electrode are sequentially formed over a substrate obtained through a certain process. Herein, the metal layer for a lower electrode and metal layer for an upper electrode may be the Ru layer with a low resistivity. The Ru layer is formed through an Atomic Layer Deposition (ALD) process because of a structural characteristic of the MIM capacitor.

However, when the Ru layer is formed through the ALD process, an adhesive strength is not good even though the adhesive strength changes according to the substrate material which is an adhesion target. Thus, the Ru layer swells up in a blister shape (i.e., lose adhesion and delaminates). This result makes it hard to fabricate the capacitor and deteriorates the characteristics, e.g., capacitance and leakage current. A technology needs to be developed for increasing the adhesive strength of the Ru layer during the fabrication of the capacitor using the Ru layer with a low resistivity as a lower electrode or an upper electrode.

SUMMARY OF THE INVENTION

Embodiments of the present invention relate to a method for fabricating a capacitor in a semiconductor device.

In this invention, when a capacitor is fabricated using a Ru layer, an adhesion strength of the Ru layer increases. Thus, it becomes easy to fabricate the capacitor and improve an electric characteristic thereof.

In accordance with an aspect of the present invention, there is provided a method for fabricating a capacitor. The method includes providing a substrate having a capacitor region is employed, forming a first $RU_{1-x}O_x$ layer over the substrate, forming a Ru layer for a lower electrode over the first $Ru_{1-x}O_x$ layer and deoxidizing the first $Ru_{1-x}O_x$ layer, forming a dielectric layer over the Ru layer for a lower electrode, and forming a conductive layer for an upper electrode over the dielectric layer, wherein the first $RU_{1-x}O_x$ layer contains oxygen in an amount less than an oxygen amount of a $RuO_2$ layer.

BRIEF DESCRIPTION OF THE DRAWINGS

FIGS. 2A to 2I are cross-sectional views describing a method for fabricating a capacitor in accordance with an embodiment of the present invention.

DESCRIPTION OF SPECIFIC EMBODIMENTS

Embodiments of the present invention relate to a method for fabricating a capacitor in a semiconductor device.

Figure 1:
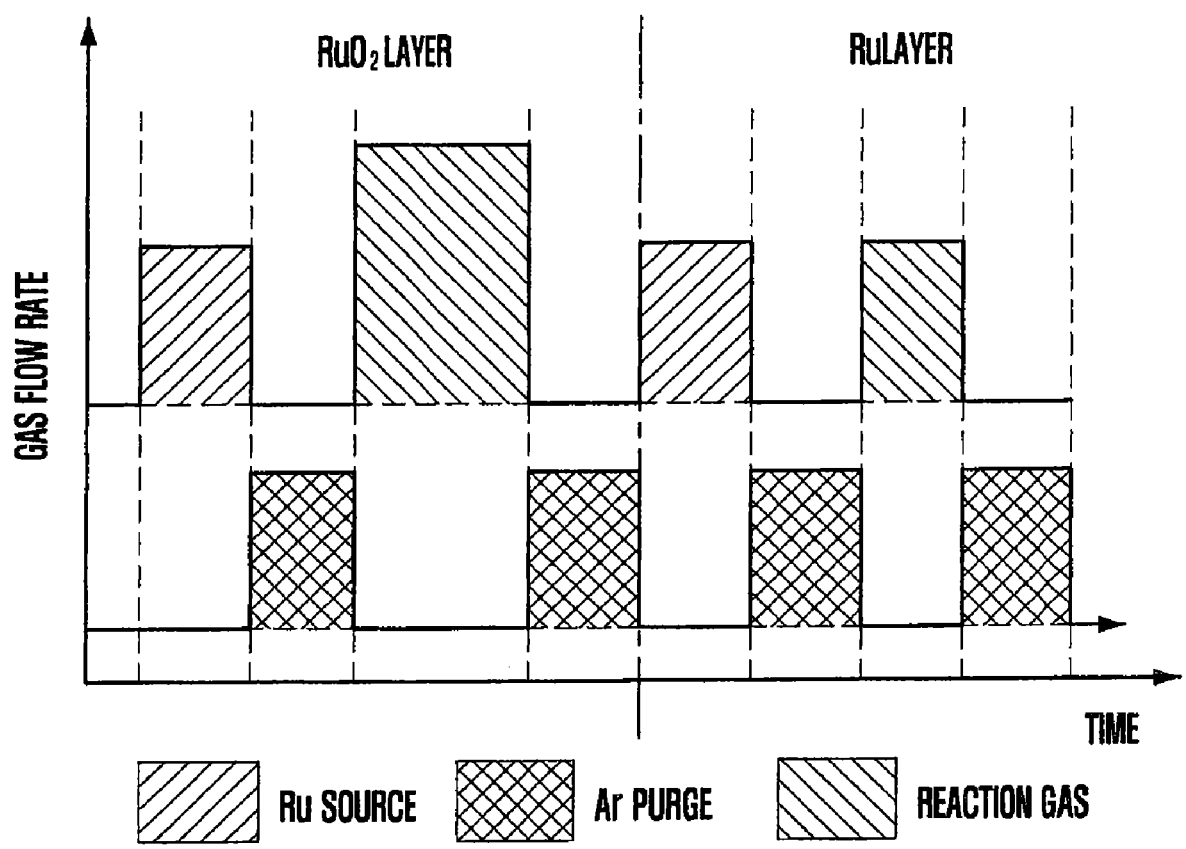
FIG. 1 is a graph describing a method for forming a ruthenium oxide ($RuO_2$) layer and a Ru layer through an ALD process.

FIG. 1 is a graph describing a method for forming a $RuO_2$ layer and a Ru layer through an ALD process.

Referring to FIG. 1, a $RuO_2$ layer and Ru layer are formed through the ALD method including four processes. In a first process, a Ru source is implanted into a reaction chamber. In a second process, the reaction chamber is purged with argon (Ar) gas or nitrogen ($N_2$) gas. In a third process, a reaction gas including oxygen ($O_2$) or ozone ($O_3$) is implanted (or supplied to provided) into the reaction chamber. In the fourth process, the reaction chamber is purged with the Ar gas or $N_2$ gas to remove the gas that is not used in the reaction.

Flow rate of the reaction gas or implanting time may change. That is, when the Ru layer is formed, the flow rate or implanting time of the reaction gas is controlled to be under a certain value to form the Ru layer not containing the $O_2$. The reaction gas including the $O_2$ or $O_3$ is not included in the Ru layer but forms the Ru layer by decomposing a Ru source. On the other hand, when the $RuO_2$ layer is formed, the flow rate and implanting time of the reaction gas increase to a certain degree for the Ru layer to contain the $O_2$.

One cycle includes first to fourth processes. By repeating the cycle, the $RuO_2$ layer and Ru layer may be formed to have a uniform and desired thickness.

FIGS. 2A to 2I illustrate cross-sectional views describing a method for fabricating a capacitor in accordance with an embodiment of the present invention. In this invention, a method for fabricating a cylinder-type capacitor is described as an example. However, this invention can be applied to other planar or concave-type capacitors.

Figure 2A:
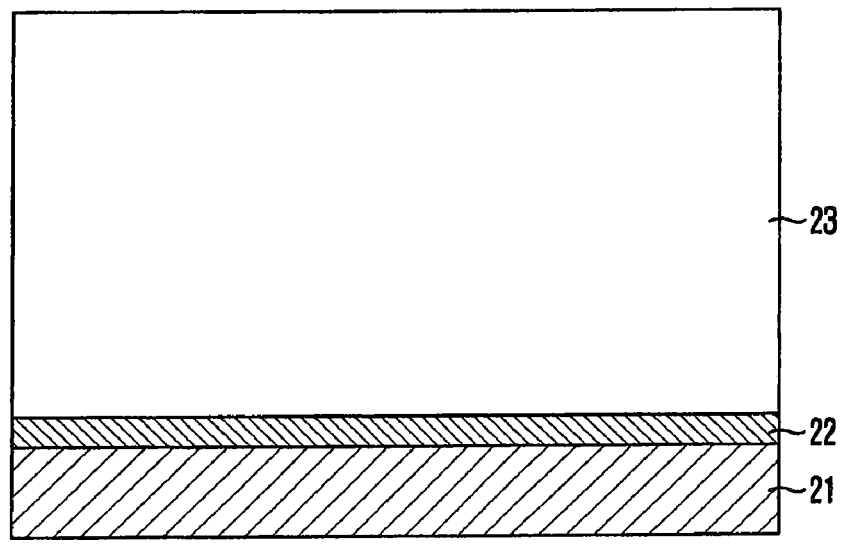

Referring to FIG. 2A, etch stop layer 22 and mold oxide layer 23 are formed over a substrate 21 including a certain lower structure. The mold oxide layer 23 may be formed to have a thickness of approximately 1.5 μm.

Figure 2B:
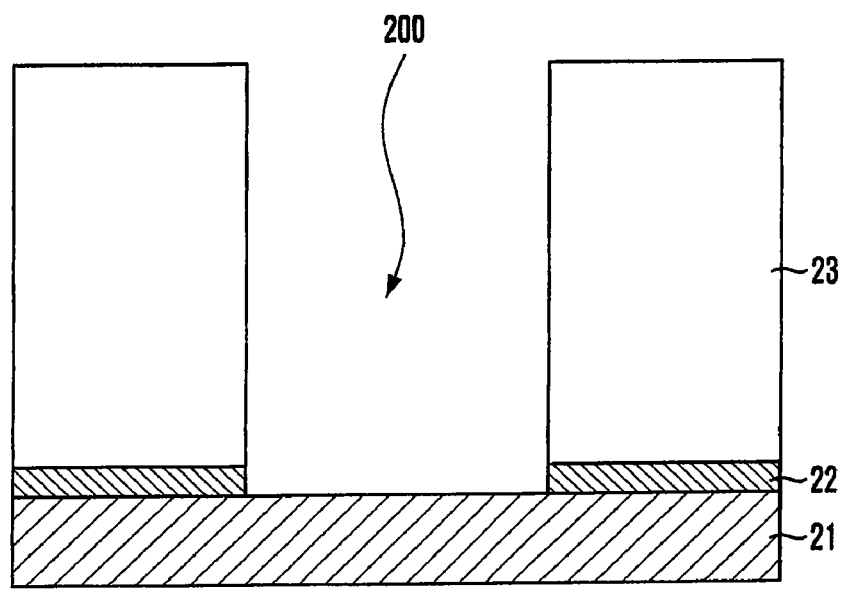

Referring to FIG. 2B, the mold oxide layer 23 and etch stop layer 22 are selectively etched to expose a certain portion of the substrate 21, e.g., a storage node contact. Thus, a capacitor region 200 is confined. The capacitor region 200 may have a width of approximately 150 nm and a depth of approximately 1.5 μm.

Figure 2C:
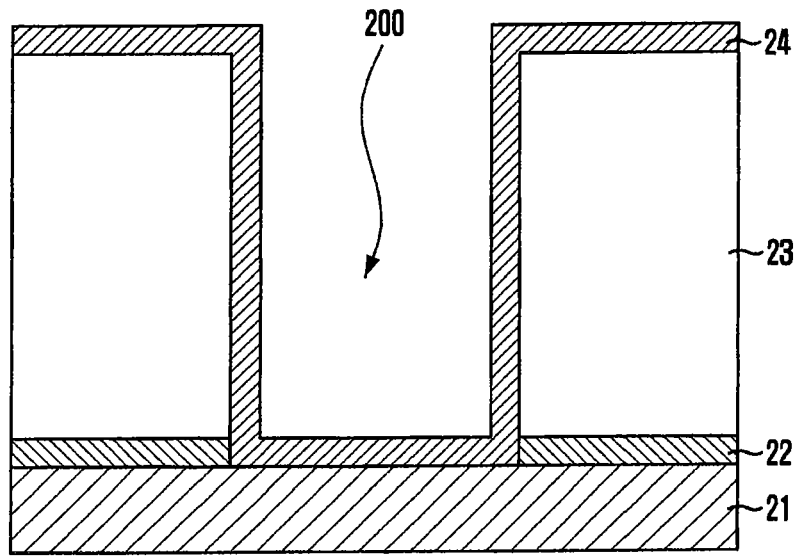

Referring to FIG. 2C, a first $Ru_{1-x}O_x$ layer 24 is formed over a resultant structure including the capacitor region 200. When the Ru layer contains $O_2$, the adhesion characteristic gradually improves. However, when the Ru layer for a lower electrode is formed through a subsequent process after the first $Ru_{1-x}O_x$ layer 24 is formed, the Ru layer for a lower electrode swells up to have a blister shape due to the first $Ru_{1-x}O_x$ layer 24 functioning as an adhesion layer.

When the Ru layer for a lower electrode is formed over the first $Ru_{1-x}O_x$ layer 24, the first $Ru_{1-x}O_x$ layer 24 may be completely deoxidized. This result is obtained because a layer neighboring the first $Ru_{1-x}O_x$ layer 24 is oxidized during a subsequent heat treatment process when the first $Ru_{1-x}O_x$ layer 24 remains after the Ru layer for a lower electrode is formed. This can cause the electric characteristics of the capacitor to change. Thus, the first $Ru_{1-x}O_x$ layer 24 contains less $O_2$ than general ruthenium oxide, i.e., a $RuO_2$ layer, to be completely deoxidized. The $RuO_2$ layer contains Ru of approximately 33% and $O_2$ of approximately 67%. However, the first $Ru_{1-x}O_x$ layer 24 in this invention may include $O_2$ not more than approximately 33%. Preferably, the first $Ru_{1-x}O_x$ layer 24 contains $O_2$ not more than approximately 65% ($x \leq 0.65$).

The method for fabricating the $Ru_{1-x}O_x$ layer containing $O_2$ less than the $RuO_2$ layer will be described with reference to FIG. 3.

Figure 2D:
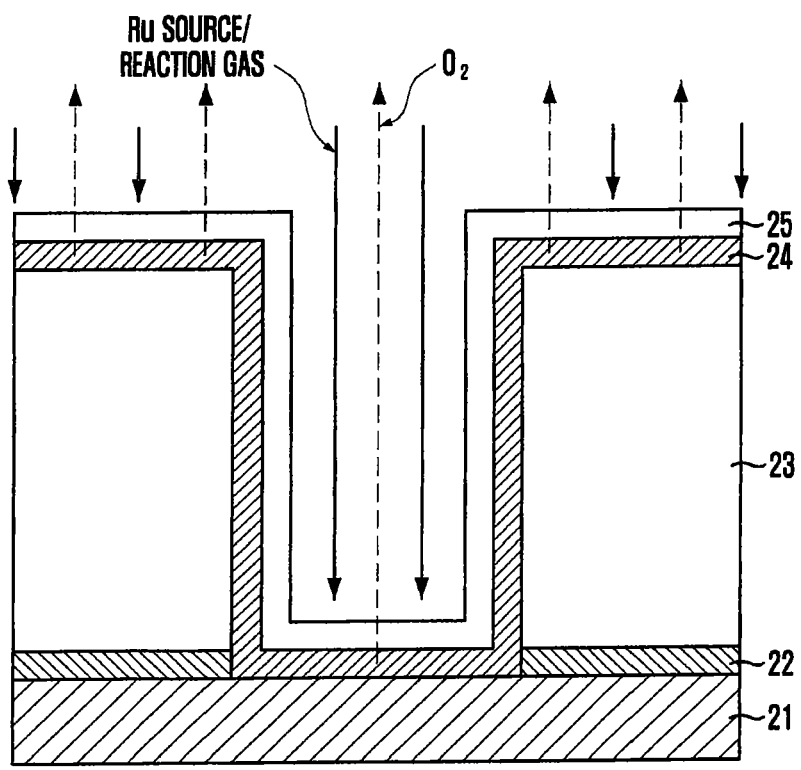

Referring to FIG. 2D, a first Ru layer 25 for an initial lower electrode. The first Ru layer 25 is formed through the process performed in FIG. 1. That is, one cycle includes first to fourth processes. By repeating the cycle, the first Ru layer 25 is formed to have a desired thickness. Particularly, in the third process, when the reaction gas is implanted into a reaction chamber, a flow rate or implanting time of the reaction gas is adjusted to be not greater than a certain value.

specifically, the first Ru layer 25 is formed at a temperature of approximately 200° C. to approximately 400° C. by implanting Ru source flowing at a rate of approximately 50 sccm to approximately 500 sccm for approximately 0.1 seconds to approximately 10 seconds (the first process), $N_2$ gas flowing at a rate of approximately 100 sccm to approximately 900 sccm for approximately 1 second to approximately 5 seconds (the second and third processes), $O_2$ gas flowing at a rate of approximately 200 sccm to approximately 1,000 sccm for approximately 1 second to approximately 10 seconds (the third process).

The reaction gas may include one selected from a group consisting of $O_2$, $O_3$, hydrogen ($H_2$), $H_2O$, ammonia ($NH_3$), and a combination thereof.

As described, since the first Ru layer 25 is formed over the first $Ru_{1-x}O_x$ layer 24 with excellent adhesion strength, it is possible to prevent the first Ru layer 25 from swelling up (i.e., delaminating) due to an adhesion defect.

Furthermore, referring to arrows in FIG. 2D, when the first Ru layer 25 is formed, the $O_2$ gas contained in the first $Ru_{1-x}O_x$ layer 24 is removed by the Ru source and reaction gas. Thus, the first $Ru_{1-x}O_x$ layer 24 is deoxidized into the Ru layer. As described, since the first $Ru_{1-x}O_x$ layer 24 does not contain much $O_2$ gas, it may be easily deoxidized.

Figure 2E:
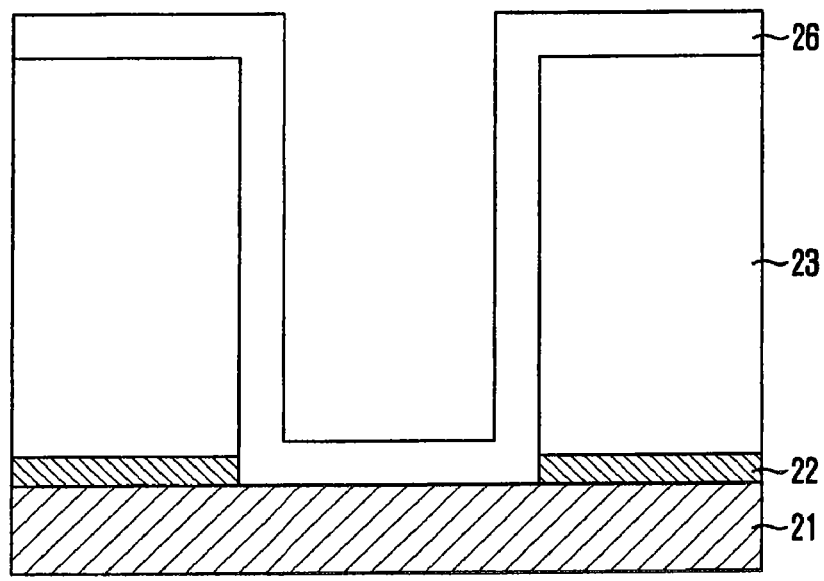

Referring to FIG. 2E, a second Ru layer 26 for a final lower electrode including the Ru layer and the first Ru layer 25 is formed over a resultant structure including a capacitor region 100. The Ru layer can be acquired by completely deoxidizing the first $Ru_{1-x}O_x$ layer 24.

The process for forming the first $Ru_{1-x}O_x$ layer 24 and first Ru layer 25 is performed In-situ.

Figure 2F:
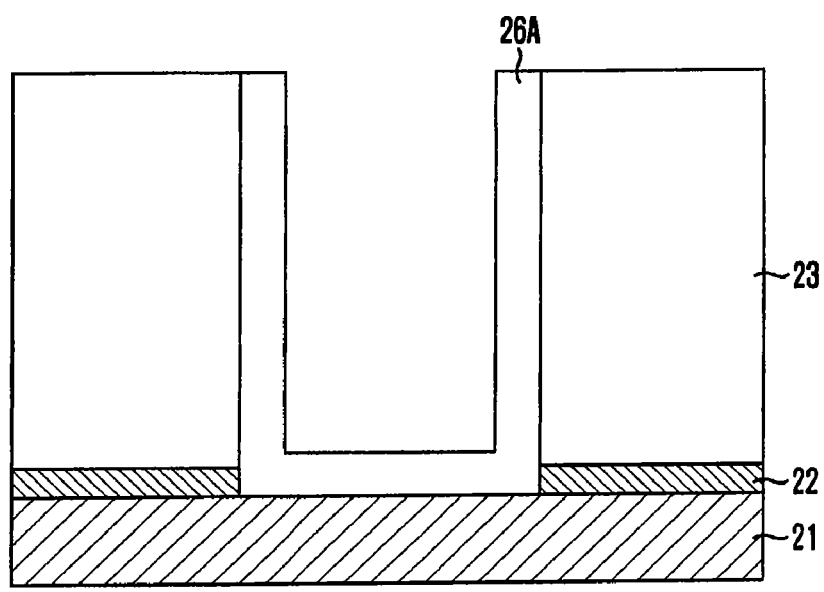

Referring to FIG. 2F, a chemical mechanical polishing (CMP) or an etch-back process is performed until the mold oxide layer 23 is exposed to divide a node of the second Ru layer 26. The second Ru layer 26 with divided node is called a Ru lower electrode 26A.

Figure 2G:
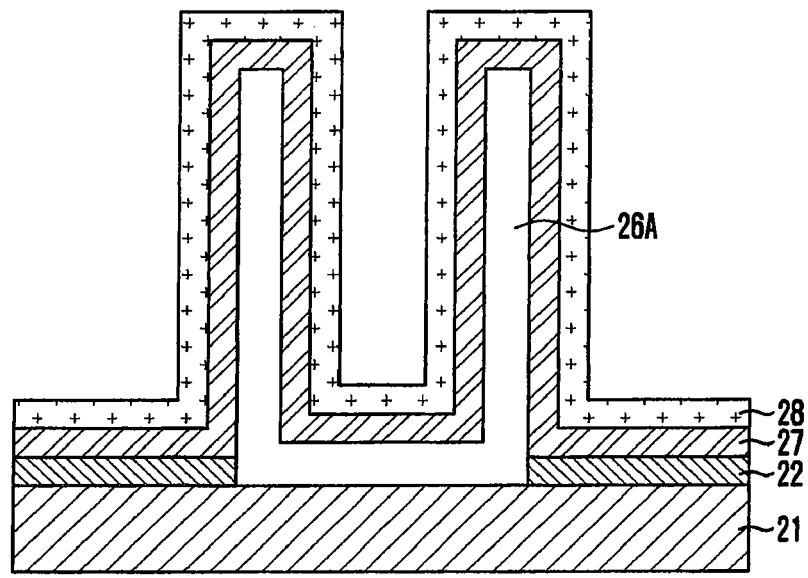

Referring to FIG. 2G, the mold oxide layer 23 is removed through a wet etch process using Buffered Oxide Echant (BOE) to form the Ru lower electrode in a cylinder type. The wet etch process is performed to form the cylinder-typed capacitor and may be omitted. When the removal process of the mold oxide layer 23 is omitted, a concave-type capacitor is formed.

A dielectric layer 27 is formed over a resultant structure including the Ru lower electrode 26A. The dielectric layer 27 is formed through the ALD process to have a high permittivity.

A second $Ru_{1-x}O_x$ layer 28 ($x \leq 0.65$) is formed over the dielectric layer 27. The second $Ru_{1-x}O_x$ layer 28 is formed through the process performed to form the first $Ru_{1-x}O_x$ layer 24 (refer to FIG. 3).

Figure 2H:
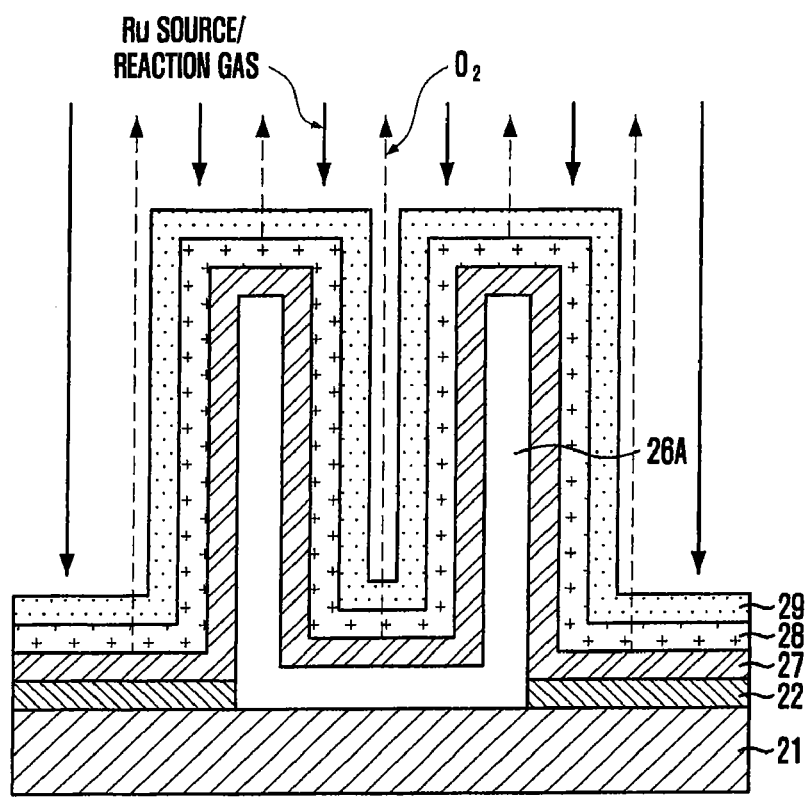
Figure 21:
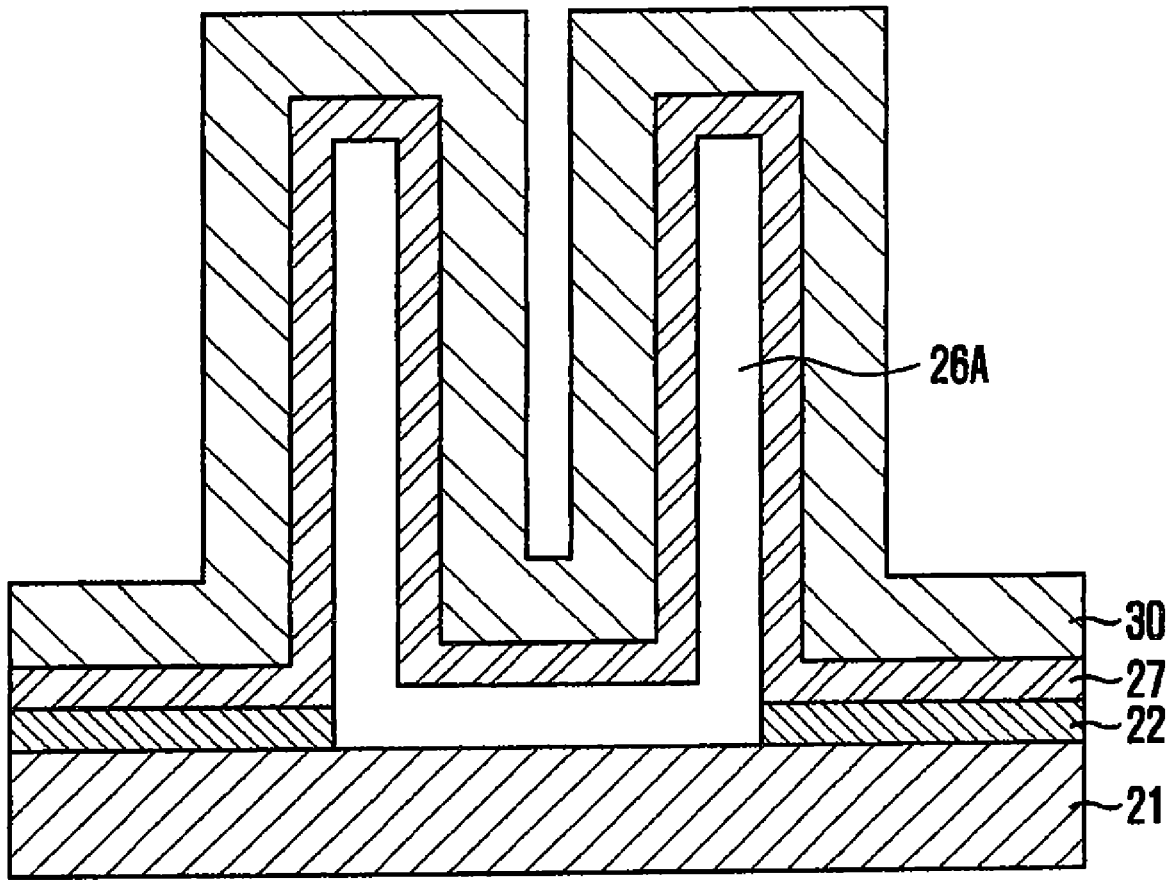

Referring to FIG. 2H, a third Ru layer 29 for an initial upper electrode is formed over the second $Ru_{1-x}O_x$ layer 28. The third Ru layer 29 is formed through the process performed to form the first Ru layer 25. Thus, the second $Ru_{1-x}O_x$ layer 28 is deoxidized into the Ru layer.

Referring to FIG. 2I, the Ru layer which is deoxidized from the second $Ru_{1-x}O_x$ layer 28 and a fourth Ru layer 30 for a final upper electrode are formed over the dielectric layer 27.

Figure 3:
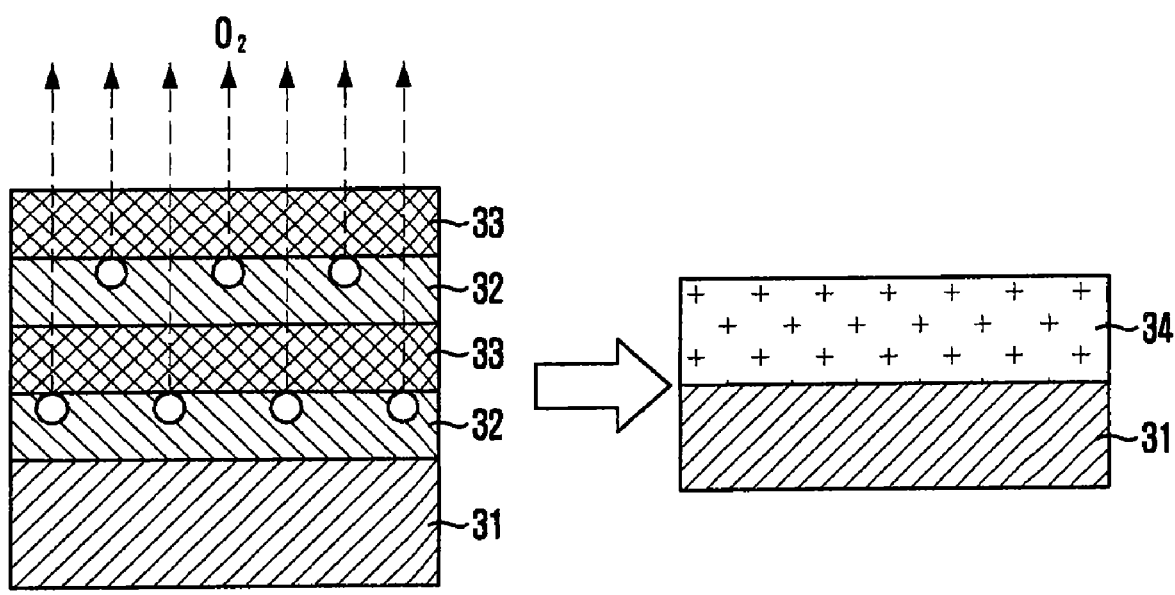
FIG. 3 is a cross-sectional view describing a method for forming a $Ru_{1-x}O_x$ layer containing less $O_2$ than the $RuO_2$ layer.

FIG. 3 is a cross-sectional view describing a method for forming a $Ru_{1-x}O_x$ layer containing less $O_2$ than the $RuO_2$ layer.

Referring to FIG. 3, a $RuO_2$ layer 32 is formed over a substrate 31. The $Ru_{1-x}O_x$ layer is formed through the process performed in Fig. FIG. 1. That is, one cycle includes the first to fourth processes. By repeating the cycle, the $RuO_2$ layer 32 is formed to have a desired thickness. Particularly, when the reaction gas including the $O_2$ or $O_3$ is implanted into a reaction chamber in the third process, the flow rate and implanting time of the reaction gas is greater than that for the process for forming the Ru layer.

A fifth Ru layer 33 is formed over the $RuO_2$ layer 32. The $RuO_2$ layer 32 is formed through the process described in FIG. 1. That is, one cycle includes the first to fourth processes. By repeating the cycle, the $RuO_2$ layer 32 is formed to have a desired thickness. Particularly, in the third process, when the reaction gas including the $O_2$ or $O_3$ is implanted into the reaction chamber, the flow rate and implanting time of the reaction gas is not greater than a certain value. Thus, the Ru layer does not contain the $O_2$.

When the fifth Ru layer 33 is formed, the $O_2$ contained in the $RuO_2$ layer 32 is removed using the Ru source and reaction gas. However, since the $RuO_2$ layer 32 contains the $O_2$ of approximately 67%, it cannot be completely deoxidized during the formation of the Ru layer 33. The $RuO_2$ layer 32 may contain less $O_2$.

The formation of the $RuO_2$ layer 32 and fifth Ru layer 33 is repeatedly performed. In FIG. 3, this process is performed twice. However, the process can be performed more than that. The amount of the $O_2$ contained in the $RuO_2$ layer 32 gradually reduces and a $Ru_{1-x}O_x$ layer 34 is formed to have a desired amount of the $O_2$.

To be specific, the $RuO_2$ layer 32 and fifth Ru layer 33 are formed at a temperature of approximately 200° C. to approximately 400° C. by implanting a Ru source flowing at a rate of approximately 50 sccm to approximately 500 sccm for approximately 0.1 seconds to approximately 10 seconds (the first process), $N_2$ gas flowing at a rate of approximately 100 sccm to approximately 900 sccm for approximately 1 second to approximately 5 seconds (the second and fourth processes), $O_2$ gas flowing at a rate of approximately 200 sccm to approximately 1,000 sccm for approximately 1 second to approximately 10 seconds (the third process). The flow rate and implanting time of the reaction gas used for forming the $RuO_2$ layer 32 are greater than those for forming the fifth Ru layer 33.

The reaction gas may include one selected from the group consisting of $O_2$, $O_3$, $H_2$, $H_2O$, $NH_3$, and a combination thereof.

After the $RuO_2$ layer 32 and Ru layer 33 are formed, a subsequent heat treatment process may be performed to increase an oxidization degree. The subsequent heat treatment process may be a rapid heating or a furnace heating performed at a temperature of approximately 200° C. to approximately 600° C.

The $RuO_2$ layer 32 and Ru layer 33 are alternatively and repeatedly formed In-situ.

When the capacitor is formed, the $Ru_{1-x}O_x$ layer with good adhesion strength is formed below the Ru layer. Thus, the adhesion strength of the Ru layer increases. Herein, the x of the $Ru_{1-x}O_x$ layer is not greater than 0.65. Thus, when the Ru layer is formed, the $Ru_{1-x}O_x$ layer is completely deoxidized to thereby improve the electric characteristic of the capacitor.

In this invention, when a capacitor is fabricated using a Ru layer, a $Ru_{1-x}O_x$ layer is formed below the Ru layer to increase an adhesion strength of the Ru layer while easily deoxidizing the $Ru_{1-x}O_x$ layer. Thus, it is possible to easily fabricate the capacitor and improve an electric characteristic of the capacitor.

While the present invention has been described with respect to specific embodiments, the above embodiments of the present invention are illustrative and not limitative. It will be apparent to those skilled in the art that various changes and modifications may be made without departing from the spirit and scope of the invention as defined in the following claims.

What is claimed is:

1. A method for fabricating a capacitor, the method comprising:
   providing a substrate having a capacitor region;
   forming a first $Ru_{1-x}O_x$ layer over the substrate;
   forming a Ru layer for a lower electrode over the first $Ru_{1-x}O_x$ layer and deoxidizing the first $Ru_{1-x}O_x$ layer;
   forming a dielectric layer over the Ru layer for the lower electrode; and
   forming a conductive layer for an upper electrode over the dielectric layer,
   wherein the first $Ru_{1-x}O_x$ layer contains oxygen in an amount less than an oxygen amount of a $RuO_2$ layer.

2. The method of claim 1, wherein forming the first $Ru_{1-x}O_x$ layer comprises:
   forming a $RuO_2$ layer over the substrate; and
   forming a Ru layer over the $RuO_2$ layer,
   wherein forming the $RuO_2$ layer and forming the Ru layer are alternately and repeatedly performed.

3. The method of claim 2, wherein forming the $RuO_2$ layer, forming the Ru layer and forming the Ru layer for the lower electrode are performed through an Atomic Layer Deposition (ALD) process.

4. The method of claim 3, wherein forming the $RuO_2$ layer, forming the Ru layer and forming the Ru layer for the lower electrode further comprise a cycle of:
   providing a Ru source into a reaction chamber at a given flow rate for a given time period;
   purging the reaction chamber;
   providing a reaction gas into the reaction chamber; and
   purging the reaction chamber,
   wherein the cycle is executed at least once.

5. The method of claim 4, wherein the reaction gas includes $O_2$ gas or $O_3$ gas, or both.

6. The method of claim 5, wherein the reaction gas includes one selected from the group consisting of hydrogen ($H_2$), dihydrogen monoxide ($H_2O$), ammonia ($NH_3$), and a combination thereof.

7. The method of claim 4, wherein the flow rate and the time period associated with forming the $RuO_2$ layer are greater than the flow rate and the time period associated with forming the Ru layer, wherein the flow rate and the time period associated with forming the $RuO_2$ layer are greater than the flow rate and the time period associated with forming the Ru layer for the lower electrode.

8. The method of claim 2, wherein forming the $RuO_2$ layer and forming the Ru layer are performed in-situ.

9. The method of claim 1, wherein forming the first $Ru_{1-x}O_x$ layer and forming the Ru layer for the lower electrode are performed in-situ.

10. The method of claim 1, wherein forming the first $Ru_{1-x}O_x$ layer and forming the Ru layer for the lower electrode are performed at a temperature of approximately 200° C. to approximately 400° C.

11. The method of claim 4, wherein forming the $RuO_2$ layer, forming the Ru layer and forming the Ru layer for the lower electrode further comprise:
   providing a Ru source into the reaction chamber at a flow rate of approximately 50 sccm to approximately 500 sccm for a first time period, the first time period being approximately 0.1 second to approximately 10 seconds;
   providing $N_2$ gas into the reaction chamber at a flow rate of approximately 100 sccm to approximately 900 sccm for a second time period, the second time period being 1 second to approximately 5 seconds; and
   providing the $O_2$ gas into the reaction chamber at a flow rate of approximately 200 sccm to approximately 1,000 sccm for a third time period, the third time period being 1 second to approximately 10 seconds,
   wherein the flow rate and the third time period of the $O_2$ gas associated with forming the $RuO_2$ layer is greater than the flow rate and the third time period of the $O_2$ gas associated with forming the Ru layer or the Ru layer for the lower electrode.

12. The method of claim 2, further comprising performing a heat treatment process after forming the $RuO_2$ layer, forming the Ru layer, and forming the Ru layer for the lower electrode.

13. The method of claim 12, wherein the heat treatment process is a rapid heating or a furnace heating performed at a temperature of approximately 200° C. to approximately 600° C.

14. The method of claim 1, wherein the capacitor is formed in a cylinder type, a concave type, or a planar type.

15. The method of claim 14, wherein forming the second $Ru_{1-x}O_x$ layer comprises:
   forming a $RuO_2$ layer over the substrate; and
   forming the Ru layer over the $RuO_2$ layer;
   wherein forming the $RuO_2$ layer over the substrate and forming the Ru layer are alternately and repeatedly performed.

16. The method of claim 15, wherein forming the $RuO_2$ layer over the substrate, forming the Ru layer and forming the Ru layer for the upper electrode are performed through an ALD process.

17. The method of claim 16, wherein forming the $RuO_2$ layer, forming the Ru layer and forming the Ru layer for the upper electrode comprises a cycle of:

providing a Ru source into a reaction chamber;
purging the reaction chamber;
providing the reaction gas into the reaction chamber; and
purging the reaction chamber,
wherein the cycle is executed one or more times.

18. The method of claim 17, wherein the reaction gas includes $O_2$ gas or $O_3$ gas, or both.

19. The method of claim 18, wherein the reaction gas includes one selected from the group consisting of $H_2$, $H_2O$, $NH_3$, and a combination thereof.

20. The method of claim 17, wherein the flow rate of the reaction gas associated with forming the $RuO_2$ layer is greater than the flow rate of the reaction gas associated with forming the Ru layer or the Ru layer for the upper electrode.

21. The method of claim 15, wherein forming the $RuO_2$ layer and forming the Ru layer are performed in-situ.

22. The method of claim 14, wherein forming the first $Ru_{1-x}O_x$ layer and forming the Ru layer for an upper electrode are performed by in-situ.

23. The method of claim 14, wherein forming the second $Ru_{1-x}O_x$ layer and forming the Ru layer and forming the Ru layer for the upper electrode are performed at a temperature of approximately 200° C. to approximately 400° C.

24. The method of claim 17, wherein forming the $RuO_2$ layer, forming the Ru layer and forming the Ru layer for the upper electrode further comprises:

providing a Ru source into the reaction chamber at a flow rate of approximately 50 sccm to approximately 500 sccm for approximately 0.1 second to approximately 10 seconds;

providing $N_2$ gas into the reaction chamber at a flow rate of approximately 100 sccm to approximately 900 sccm for approximately 1 second to approximately 5 seconds; and providing the $O_2$ gas into the reaction chamber at a flow rate of approximately 200 sccm to approximately 1,000 sccm for 1 second to approximately 10 seconds;

wherein flow rate of the $O_2$ gas associated with forming the $RuO_2$ layer is greater than the flow rate associated with forming the Ru layer or forming the Ru layer for the upper electrode.

25. The method of claim 15, further comprising performing a heat treatment process after forming the $RuO_2$ layer and forming the Ru layer.

26. The method of claim 25, wherein the heat treatment process is a rapid heating or a furnace heating performed at a temperature of approximately 200° C. to approximately 600° C.

27. The method of claim 1, wherein the capacitor is formed in a cylinder type, a concave type, or a planar type.

* * * * *